(12) United States Patent
Gaynor (10) Patent No.: US 9,136,800 B2
(45) Date of Patent: Sep. 15, 2015

(54) METHODS AND DEVICES FOR IMPROVING POWER AMPLIFIER EFFICIENCY

(71) Applicant: Peregrine Semiconductor Corporation, San Diego, CA (US)

(72) Inventor: Michael P. Gaynor, Crystal Lake, IL (US)

(73) Assignee: Peregrine Semiconductor Corporation, San Diego, CA (US)

(*) Notice: Subject to any disclaimer, the term of this patent is extended or adjusted under 35 U.S.C. 154(b) by 127 days.

(21) Appl. No.: 13/948,480

(22) Filed: Jul. 23, 2013

(65) Prior Publication Data

US 2015/0028945 A1    Jan. 29, 2015

(51) Int. Cl.
| | |
|---|---|
| *H03F 1/36* | (2006.01) |
| *H03F 3/189* | (2006.01) |
| *H03F 1/34* | (2006.01) |
| *H03F 3/19* | (2006.01) |
| *H03F 3/24* | (2006.01) |

(52) U.S. Cl.
CPC ............... *H03F 3/189* (2013.01); *H03F 1/34* (2013.01); *H03F 3/19* (2013.01); *H03F 3/245* (2013.01)

(58) Field of Classification Search
CPC ..................................... H03F 1/083

USPC ............ 330/149, 165, 195, 294, 107–100
See application file for complete search history.

(56) References Cited

U.S. PATENT DOCUMENTS

| | | | | |
|---|---|---|---|---|
| 5,767,743 | A | * | 6/1998 | Morimoto et al. ............ 330/294 |
| 7,656,229 | B2 | * | 2/2010 | Deng et al. ................... 330/149 |
| 2014/0266455 | A1 | | 9/2014 | Kaatz et al. |

OTHER PUBLICATIONS

Hilborn, Derek S., "An Adaptive Direct Conversion Transmitter", Thesis submitted in partial fulfillment of the Requirements for the Degree of Master of Applied Science in the School of Engineering Science, Simon Fraser University, Aug. 9, 1992, 86 pgs.
Hilborn, et al., "An Adaptive Direct Conversion Transmitter", IEEE Transactions on Vehicular Technology, vol. 43, No. 2, May 1994, pp. 223-233.

* cited by examiner

*Primary Examiner* — Khanh V Nguyen
*Assistant Examiner* — Khiem Nguyen
(74) *Attorney, Agent, or Firm* — Jaquez Land Richman LLP; Martin J. Jaquez, Esq.; Alessandro Steinfl, Esq.

(57) ABSTRACT

Devices and methods to reduce adjacent channel power of an amplifier are described. The adjacent channel power can be reduced by considering the third harmonic output from the amplifier, and minimizing such third harmonic amplitude by implementing a phase shifter feedback circuit to the amplifier. The phase shifter feedback circuit can shift the phase of the feedback signal in order to reduce the third harmonic amplitude, which in turn reduces the adjacent channel power.

23 Claims, 6 Drawing Sheets

METHODS AND DEVICES FOR IMPROVING POWER AMPLIFIER EFFICIENCY

BACKGROUND

1. Field

The present application relates to power amplifiers. More in particular, it relates to methods and devices for improving linear power amplifier efficiency.

2. Description of Related Art

Designing electronic circuits, in particular amplifiers, according to desired specifications can involve trying to balance efficiency and linearity. In amplifier circuits, the balancing of efficiency and linearity can be achieved with feedback circuits. However, temperatures of the amplifiers can vary from device to device, and such variations in the temperature can vary the performance of the device.

Figure 1:
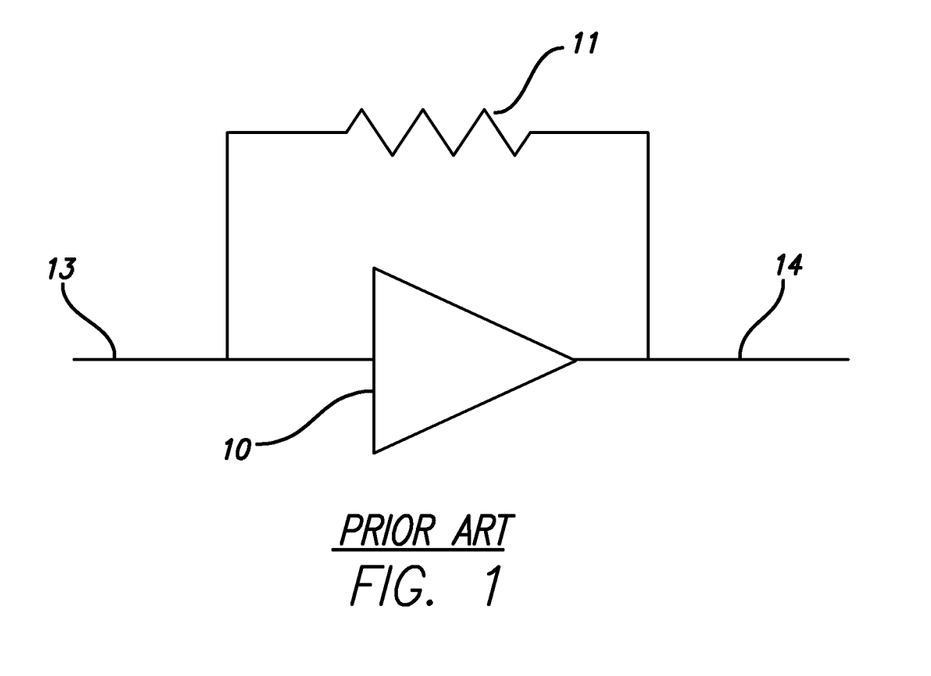
FIG. 1 shows a block diagram of a known implementation of an amplifier with a feedback loop.

Efficiency of an amplifier can be improved by introducing a feedback. FIG. 1 shows an example of a power amplifier 10 with a feedback resistor 11 to improve efficiency of the power amplifier 10. The feedback resistor 11 connects the output 14 of the power amplifier 10 to the input 13 of the power amplifier.

Given that temperature, and thus performance of a power amplifier changes from device to device, there is a need to provide control of the feedback. Additionally, there is a need to control linearity of the power amplifier, especially in terms of adjacent channel power (ACP), which is to be minimized. See, for example, *RF Power Amplifiers for Mobile Communications* by P. Reynaert and M. Steyaert, Springer Verlag (2010), Sec. 7.2.3 page 217, incorporated herein by reference.

Figure 2:
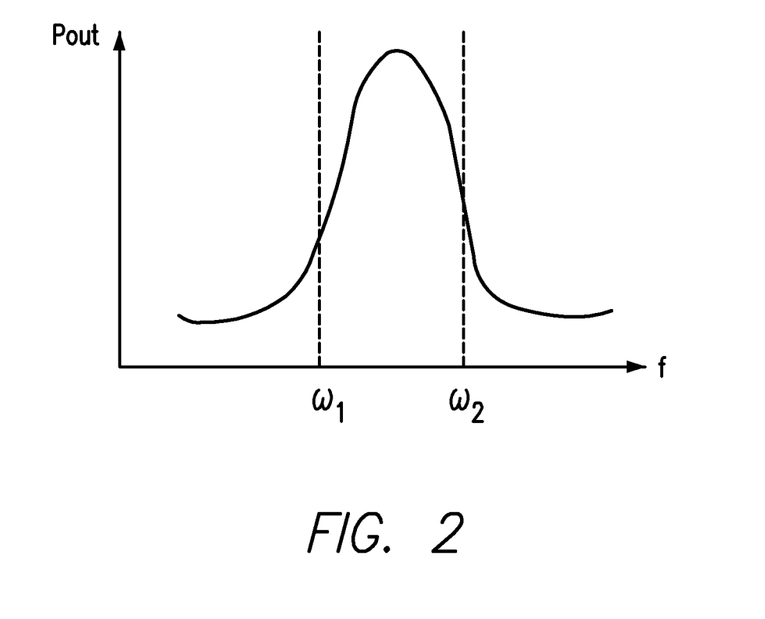
FIG. 2 shows an example spectral diagram of output power vs. frequency.

By way of example, FIG. 2 shows a spectral diagram of output power from the power amplifier(s), shown as $P_{out}$, as a function frequency, shown as f. In designing RF power amplifiers, the person skilled in the art would appreciate that output power is desirable in selected bandwidth regions, such as the region shown between $\omega_1$ and $\omega_2$. On the other hand, output power is not desirable in other regions, such as in the adjacent channels, shown as the regions to the left of $\omega_1$, and the regions to the right of $\omega_2$. In other words, ACP should be kept as low as possible in order to avoid leakage into adjacent channels, which can violate design specifications, which in turn, can violate, for example, Federal Communications Commission (FCC) regulations by transmitting in unauthorized channels.

SUMMARY

According to a first aspect, a method for increasing efficiency of a power amplifier circuit is described. The method comprises providing the power amplifier circuit with a feedback arrangement, where the feedback arrangement comprises a phase shifter. The method further comprises measuring with a control circuit, an odd harmonic amplitude from an output of the power amplifier circuit, and adjusting the phase shifter upon measurement of the odd harmonic amplitude in order to minimize the odd harmonic amplitude through the feedback arrangement.

According to a second aspect, a circuital arrangement is described. The circuital arrangement comprises a feedback circuit comprising a phase shifter, and a control circuit adapted to measure an odd harmonic amplitude, where the control circuit is connected to a control signal input of the phase shifter. The phase shifter is adjustable according to an amount of the odd harmonic amplitude measured by the control circuit.

According to a third aspect, a circuital arrangement to reduce adjacent channel power of a power amplifier is described. The circuital arrangement comprises a power amplifier feedback circuit comprising a phase shifter, where the phase shifter is connected from an output of the power amplifier to an input of the power amplifier. The circuital arrangement further comprises a coupler to the power amplifier. The coupler measures a power amplifier parameter indicative of the adjacent channel power and configured to send a control signal to a control signal input of the phase shifter, where the phase shifter shifts phase of an input to the power amplifier in accordance with the measured power amplifier parameter, in order to reduce an amount of the power amplified parameter, thus reducing the adjacent channel power.

According to a fourth aspect, a method for reducing an adjacent channel power of a power amplifier is described. The method comprises providing a power amplifier circuit with a feedback arrangement, the feedback arrangement comprising a phase shifter; operatively coupling a coupler to the power amplifier; measuring via the coupler a parameter indicative of the adjacent channel power; based on the measuring, generating an error signal for the phase shifter; feeding the error signal to the phase shifter; based on the feeding, shifting an input phase of an input signal to the power amplifier, and based on the shifting, reducing an adjacent channel power.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout the present disclosure, embodiments and variations are described for the purpose of illustrating uses and implementations of the inventive concept. The illustrative description should be understood as presenting examples of the inventive concept, rather than as limiting the scope of the concept as disclosed herein. Like reference numerals indicate corresponding parts in various figures.

Figure 3:
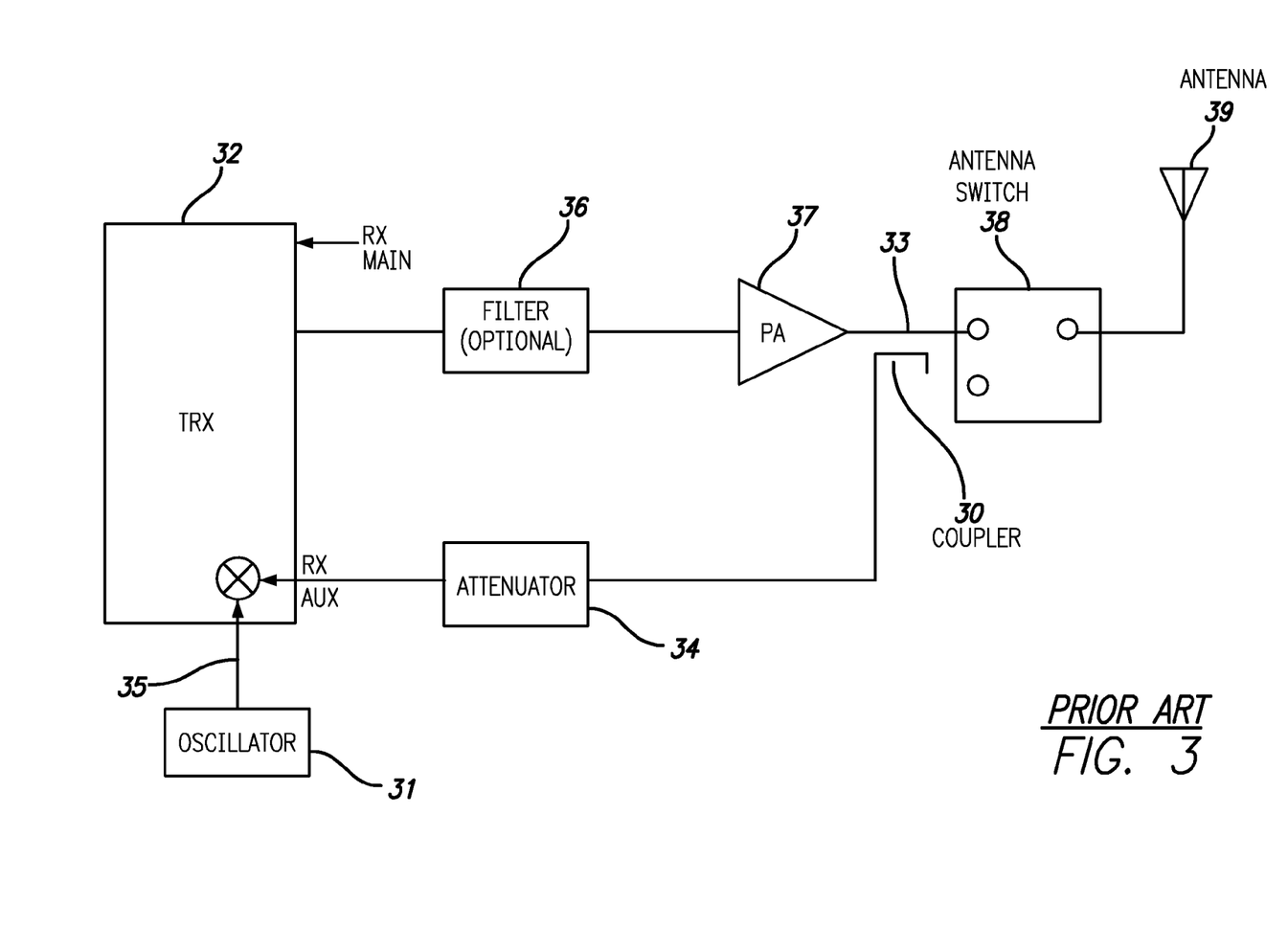
FIG. 3 shows a known implementation of a power amplifier with a feedback receiver.

One possible method to minimize spectral splatter from adjacent channel is to provide a feedback receiver (e.g. attenuator 34) in the transmitter circuitry as shown in FIG. 3, wherein an attenuator 34 is used in the feedback path. Furthermore, FIG. 3 shows a transceiver 32 electrically connected to an amplifier 37, an antenna switch 38, and an antenna 39. A filter may be placed between the transceiver 32 and the amplifier 37. A portion of a transmitted signal 33 is coupled 30 and sent through an attenuator 34, to a receiver. The receiver can be a separate receiver from the transceiver or it can be the same receiver as the main receiver (as in FIG. 3), thus being comprised in the transceiver 32. For example, in a Time Division Multiple Access (TDMA) system, the receiver can be the same receiver as the main receiver. On the other hand, in a Frequency Division Multiple Access (FDMA) system, the receiver can be a separate independent receiver. In the transceiver 32, the coupled signal is mixed with an oscillator signal 35 provided by an oscillator 31 in order to measure, and thus reduce the ACP at baseband. The spectral splatter from the adjacent channel can be detected and correspondingly modified in order to reduce the undesired ACP. More details can be found, for example in "An adaptive direct conversion transmitter", Hilborn, D. S.; Stapleton, S. P.; Cavers, J. K., Vehicular Technology, IEEE Transactions, Volume: 43 , Issue: 2, may, 1994, Page(s): 223-233, which is incorporated herein by reference in its entirety. The disadvantage of such realization is the high amount of power spent by the receiver during use. Therefore, there is a need for increasing efficiency of a power amplifier without spending an unwanted amount of power.

Figure 4:
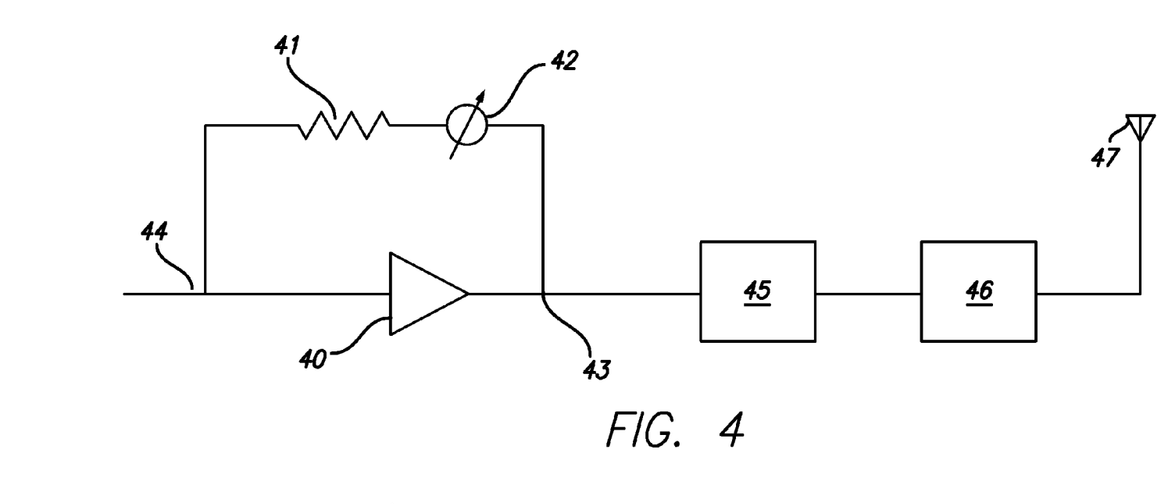
FIG. 4 shows an amplifier with a phase shift feedback loop according to an embodiment of the present disclosure.

According to an embodiment of the present disclosure, FIG. 4 shows an exemplary circuit comprising a power amplifier 40 with a feedback resistor 41 and a feedback phase shifter 42, feeding back an output 43 of the power amplifier to an input signal 44 of the power amplifier. The output 43 can be connected, by way of example and not of limitation, to a filter 45 (e.g., low pass filter), and then connected to an antenna 47 via an antenna switch 46 for transmission of the signal that was amplified through the power amplifier 40. By coupling the feedback phase shifter 42 before the filter 45, the amplitude of the harmonic signal sensed by the phase shifter 42 is larger than if the feedback phase shifter 42 was coupled after the filter 45.

Figure 5:
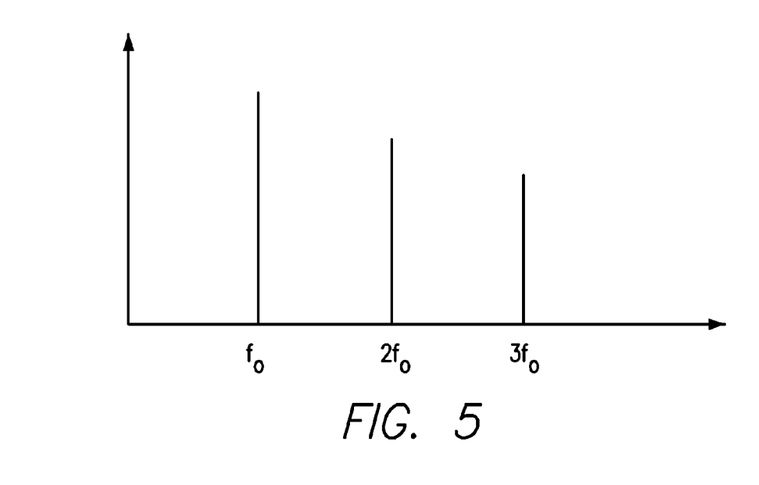
FIG. 5 is a frequency vs. amplitude graph of various harmonic outputs from an amplifier.

The Applicant has noted that reducing the power in the adjacent channel as shown in FIG. 2 is related to minimization of the third harmonic $3 f_0$ of the output of the power amplifier, represented, for example, in FIG. 5. Therefore, in accordance with an embodiment of the present disclosure, the phase shifter 42 of FIG. 4 can be used to adjust (e.g., shift) the phase of the input signal 44 in order to minimize the third harmonic $3 f_0$ of the output 43, which in turn, can reduce the power in the adjacent channels, thereby increasing the efficiency of the power amplifier 40 without the use of a receiver or other power-consuming circuitry. Similarly, reducing the power in an alternate channel is related to minimization of the fifth harmonic $5 f_0$ of the output of the power amplifier. A person skilled in the art would appreciate that a substantially similarly configured circuitry can be implemented to reduce the output power in the alternate channel. By way of example and not of limitation, the phase shifter 42 of FIG. 4 can be any off-the-shelf phase shifter such as JSPHS-1000 by MINI-CIRCUITS®, or other similar phase shifters.

Figure 6:
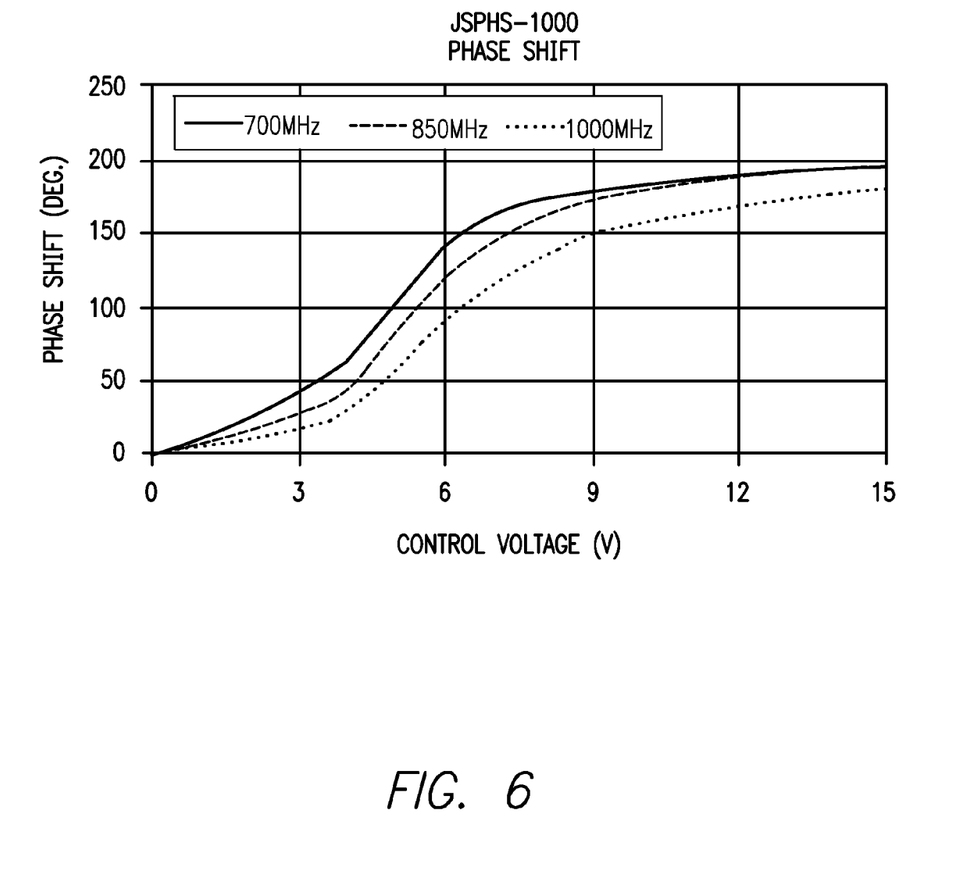
FIG. 6 shows an example graphical phase shift response of an off-the-shelf phase shifter with respect to given control voltages.

Such off-the-shelf phase shifters can be configured to shift phase of the signal automatically when the phase shifter is signaled by a control signal (e.g., control voltage). See for example, FIG. 6 which shows a control voltage vs. phase shift diagram for an exemplary off-the-shelf phase shifter. The graph of FIG. 6 shows that for a given control signal, the phase shifter will shift the signal by a certain number of degrees, as shown in the y-axis of the graph. For example, for a given signal that is desired to be minimized (e.g., third harmonic, fifth harmonic, seventh harmonic etc. of the amplifier output signal), the phase shifter can be configured to automatically shift the phase by a certain number of degrees until a desired amplitude of the output of the amplifier signal is achieved (e.g., the amplitude of the third harmonic and/or fifth harmonic and/or seventh harmonic of the output is less than some threshold amplitude). In the case that the circuit is in a FDMA system, the phase shifting can take place in a continuous manner. In the case that the circuit is in a TDMA system, the phase shifting can be configured to occur in, for example, bursts (e.g., at the beginning of every burst, every second burst, every third burst, or other number of bursts). The graph of FIG. 6 is intended to show the relationship between a control signal and the magnitude of the phase shift for an example off-the-shelf phase shifter, and is not intended to be limiting or to provide specific magnitudes of phase shift.

Figure 7:
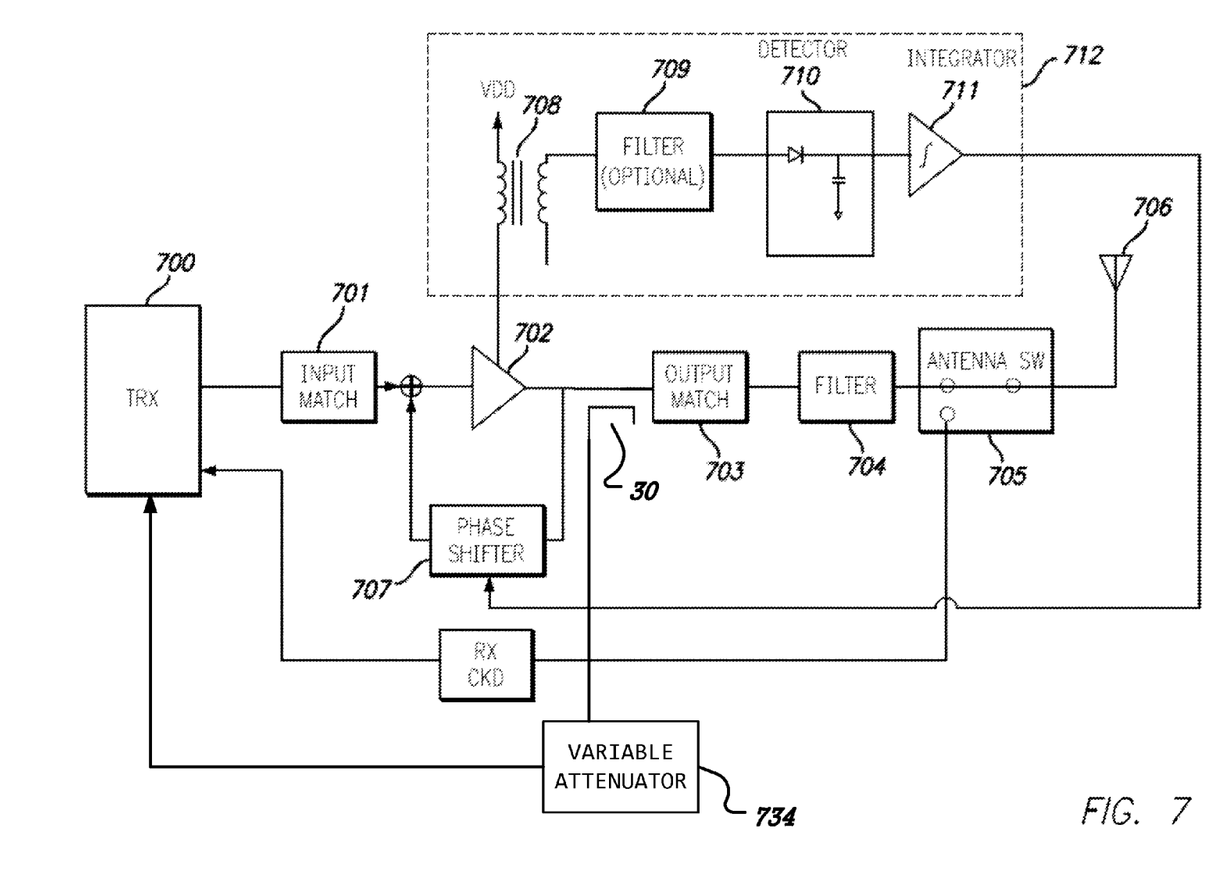
FIG. 7 shows a block diagram of an amplifier circuit with a phase shifter feedback loop controlled by a controller circuit according to the amplitude of a third harmonic of the amplifier output.

FIG. 7 shows a detailed block diagram of an implementation of a power amplifier system with a phase shifter feedback circuit 707 to reduce ACP by minimizing the third harmonic of the output of the power amplifier. A transceiver 700 provides a transmitting signal via an input matching circuit 701 to a power amplifier 702 for amplification of the transmitting signal. The amplified output of the power amplifier 702 is fed to an output matching circuit 703 for impedance matching, and then to a low pass filter 704. The output of the low pass filter 704 is ultimately connected to an antenna 706 for wireless transmission via an antenna switch 705. Similarly to FIG. 4, the phase shifter feedback circuit 707 is electrically connected to the output of the power amplifier 702, and the output of the phase shifter 707 is fed to the input of the power amplifier 702. The system may include a variable attenuator 734 to reduce the amplitude or power of an odd harmonic signal. In the example embodiment of FIG. 7, the power amplifier 702 can be a RF amplifier configured in stacked arrangement or in a cascade arrangement. Moreover, the power amplifier 702 can a scalable periphery (SP) amplifier comprised of a plurality of unit cells, each unit cell being an amplifier. More detailed information regarding SP amplifiers can be found, for example, in US patent application Ser. No. 13/797,779, entitled "Scalable Periphery Tunable Matching Power Amplifier", filed on Mar. 12, 2013, incorporated by reference herein in its entirety.

As described in previous paragraphs, the phase shifter 707 is configured to minimize the third (or higher) harmonic of the output of the power amplifier. In order to control minimization of the third harmonic, a control circuit 712 is established, from the power amplifier 702 to the phase shifter 707 in order to determine whether the third (or higher) harmonic output should be minimized by the phase shifter 707 or left as is. The control circuit 712 can comprise a coupling 708, an optional third (or higher) harmonic bandpass filter 709, a detector circuit 710, and an error generator, for example an integrator 711. An analog/digital comparator, or a sample and hold circuit can be used as an error generator in the example embodiments of the present disclosure. By way of example and not of limitation, FIG. 7 shows a transformer coupling 708 which couples the signal output from the power amplifier 702 for the control circuit 712. Such coupling of the signal from the power amplifier 702 for the control circuit 712 will be described in further detail in later paragraphs. The coupled signal is fed to the third (or higher) harmonic bandpass filter 709 to filter out all harmonic frequencies except for the third (or higher) harmonic frequency. The detector circuit 710 can be configured to smooth out the coupled (and optionally filtered) signal to a DC signal before being input to the integrator 711. By way of example and not of limitation, the detector 710 can include a simple circuital configuration as shown in FIG. 7 with a diode and a capacitor. In particular, the diode can clip away the negative portion of the coupled signal and the capacitor can smooth out the remaining positive signal to a DC signal. Now, if the DC voltage applied to the input of the integrator 711 is a constant positive/negative voltage or variable with respect to time, then the integrator 711 will send a signal (e.g., a control voltage) to the phase shifter 707 to shift the phase of the third harmonic output as a function of the magnitude of the control voltage (e.g., output from the integrator 711). Such shifting of the third harmonic signal correlates to minimization of the ACP. On the other hand, if the input DC voltage applied to the input of the integrator 711 is at 0 volt, then the integrator can send a signal to the phase shifter 707 that nothing has to be done (e.g., the third harmonic of the output does not have to be reduced) by sending a corresponding control voltage to the phase shifter 707. According to some embodiments of the present disclosure, the phase correction control signal provided by the error generator 711 to the phase shifter 707 may be a continuous signal such as to correct/adjust a phase error at all time during operation of the system. In some other embodiment according to the present disclosure, correction/adjustment can be provided at discrete times such as to correct/adjust the phase error at discrete times. Discrete time phase correction can be obtained, for example, by switching between a zero voltage signal and the output of the error generator 711 to the input of the phase shifter 707. The skilled person will know of other implementation examples to get a discrete time phase correction.

Figure 8A:
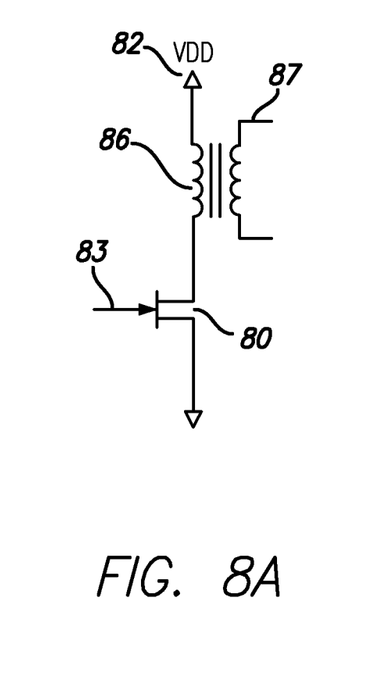
FIGS. 8A, 8B, 8C, and 8D show various configurations of coupling an output signal from an amplifier.
Figure 8B:
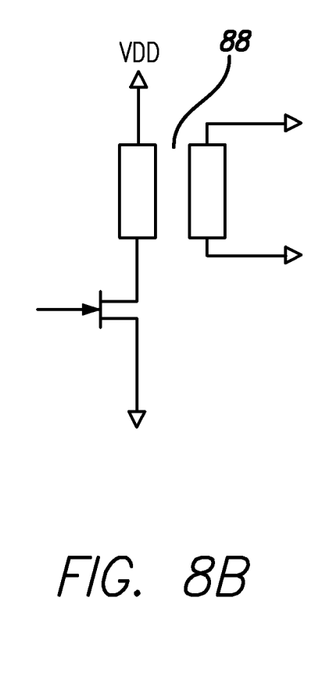
Figure 8C:
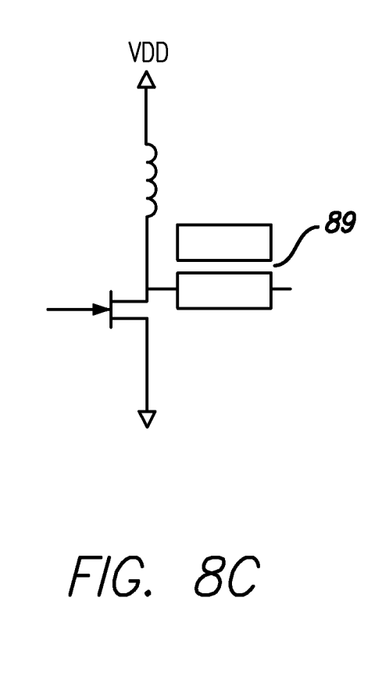
Figure 8D:
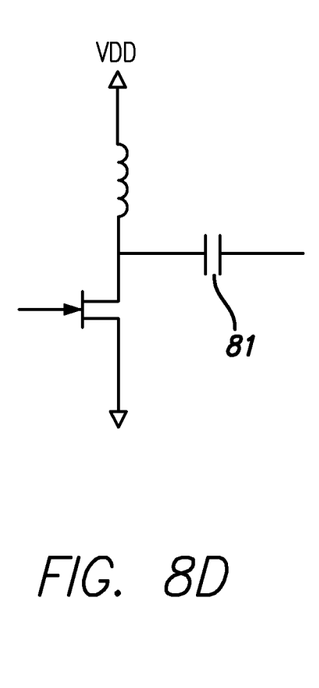

According to some embodiments of the present disclosure, FIGS. 8A-8D show circuit diagrams of various alternative embodiments for the coupling 708 shown in FIG. 7. An exemplary transistor 80 is represented as a field effect transistor (FET) in the figures, acting as the power amplifier 702 shown in FIG. 7. Transistor 80 is connected, by way of example, to a voltage source $V_{DD}$ 82 through an inductor 86. As described in previous paragraphs, in accordance with an embodiment of the present disclosure, and also as shown in FIG. 7, the amplitude of the third harmonic 3 $f_0$ of the output of the amplifier is considered and then minimized through the use of a phase shifter, if necessary. In order to consider the amplitude of the third harmonic, the inductor 86 can be, for example, coupled to a device such as a transformer, two parallel transmission lines, or a trace underneath the inductor, and so on. FIG. 8A shows an example of a transformer coupling 87 where the output signal from the power amplifier 80 is coupled to the control circuit of FIG. 7. Alternatively, FIGS. 8B-8C show examples of transmission line couplings 88, 89 and FIG. 8D shows an example of capacitive coupling 81. In the case of transmission lines, a first transmission line being a quarter wavelength long at resonant frequency $f_0$, and the second transmission line being a quarter wavelength long at 3 $f_0$. Although only three example coupling methods are shown in FIGS. 8A-8C, those skilled in the art would understand that other coupling methods can also be applicable.

The person skilled in the art will understand that use of a phase shifter feedback according to various embodiments of the present disclosure and the couplers shown in FIGS. 8A-8D consumes much less power than the prior art realization of FIG. 3. By way of example and not of limitation, a digital phase shifter will consume power on the order of microwatts, whereas the implementation of a receiver and oscillator to mix the transmit signal will consume power on the order of milliwatts.

With further reference to the exemplary couplers shown in FIGS. 8A-8D, it should be noted that the circuitry downstream of the output of the power amplifier of a power amplifier circuit can contain further couplers to which the phase shifter of the feedback circuit could be coupled. However, usually such couplers are located at a stage where the third harmonic has low amplitudes, which can make extracting the third harmonic from the signal more difficult, hence the usefulness of coupling at the output of the power amplifier as shown in FIGS. 8A-8D. However, the person skilled in the art will understand that if a coupler from which a useful third harmonic content of the output can be obtained is present, or if an amplifier is put between the coupler and the phase shifter, then such coupler can be used instead of the couplers shown in FIGS. 8A-8D.

The examples set forth above are provided to give those having ordinary skill in the art a complete disclosure and description of how to make and use the embodiments of the present disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A method for increasing efficiency of a power amplifier circuit, comprising:
   providing the power amplifier circuit with a feedback arrangement, the feedback arrangement comprising a phase shifter;
   measuring with a control circuit, an odd harmonic amplitude from an output of the power amplifier circuit;
   adjusting the phase shifter upon measurement of the odd harmonic amplitude in order to minimize the odd harmonic amplitude through the feedback arrangement; and
   providing a variable attenuator to reduce the amplitude or power of the odd harmonic signal.

2. The method of claim 1, wherein the odd harmonic is selected from a group consisting of: a third harmonic, a fifth harmonic, a seventh harmonic, and a ninth harmonic.

3. The method according to claim 1, wherein measuring the odd harmonic amplitude from the output of the power amplifier circuit comprises coupling the output of the power amplifier circuit to the control circuit through a coupler, the coupler providing the odd harmonic amplitude to the control circuit.

4. The method according to claim 3, wherein measuring the odd harmonic amplitude from the output of the power amplifier circuit further comprises filtering the coupled output of the power amplifier to extract the odd harmonic amplitude.

5. The method according to claim 3, wherein adjusting the phase shifter comprises varying the analog or digital control voltage as a function of an output of the integrator.

6. The method of claim 3, wherein the coupler is selected from a group consisting of: a transformer coupler, a capacitive coupler, and a transmission line coupler.

7. A method for increasing efficiency of a power amplifier circuit, comprising:
providing the power amplifier circuit with a feedback arrangement, the feedback arrangement comprising a phase shifter;
measuring an odd harmonic amplitude from an output of the power amplifier circuit and rectifying the odd harmonic amplitude and feeding a rectified voltage of the odd harmonic amplitude to an error generator, wherein the error generator is adapted to output a control signal having an analog or a digital control voltage to the phase shifter; and
adjusting the phase shifter upon measurement of the odd harmonic amplitude in order to minimize the odd harmonic amplitude through the feedback arrangement.

8. The method according to claim 7, wherein the error generator is selected from the group consisting of: an integrator, a comparator, and/or a sample and hold circuit.

9. The method according to claim 7, wherein measuring the odd harmonic amplitude from the output of the power amplifier circuit further comprises filtering the output of the power amplifier to extract the odd harmonic amplitude.

10. The method according to claim 7, wherein the adjusting is performed at all time or at discrete times, during operation of the power amplifier.

11. The method according to claim 7, wherein measuring the odd harmonic amplitude from the output of the power amplifier circuit comprises coupling the output of the power amplifier circuit to a control circuit through a coupler, the coupler providing the odd harmonic amplitude to the control circuit.

12. The method of claim 11, wherein the coupler is selected from a group consisting of: a transformer coupler, a capacitive coupler, and a transmission line coupler.

13. A circuital arrangement comprising:
a feedback circuit comprising a phase shifter; and
a control circuit adapted to measure an odd harmonic amplitude, the control circuit connected to a control signal input of the phase shifter, the control circuit including a detector circuit and an integrator between a coupler and the phase shifter, the integrator adapted to generate an output voltage proportional to the magnitude and duration of a rectified voltage at the input of the integrator, the rectified voltage being rectified by the detector circuit,
wherein the phase shifter is adjustable according to an amount of the odd harmonic amplitude measured by the control circuit.

14. The circuital arrangement of claim 13, further comprising a power amplifier, the feedback circuit being connected across the power amplifier, the control circuit comprising the coupler for coupling an output of the power amplifier.

15. The circuital arrangement of claim 14, wherein the coupler is selected from a group consisting of:
a transformer coupler, a capacitive coupler, and a transmission line coupler.

16. The circuital arrangement of claim 14, wherein the control circuit comprises a filter for filtering the coupled output of the power amplifier.

17. The circuital arrangement of claim 16, wherein the filter is an odd harmonic bandpass filter adapted to filter all but the odd harmonic amplitude from the output of the power amplifier.

18. The circuital arrangement of claim 14, wherein the coupler is an inductively coupled transformer or two transmission lines.

19. The circuital arrangement of claim 13, wherein the odd harmonic is selected from a group consisting of: a third harmonic, a fifth harmonic, a seventh harmonic, and a ninth harmonic.

20. The circuital arrangement of claim 13, wherein the integrator is configured to send a control signal having a voltage to the phase shifter, the voltage of the control signal varying according to the voltage of the rectified voltage.

21. A circuital arrangement to reduce adjacent channel power of a power amplifier comprising:
a power amplifier feedback circuit comprising a phase shifter, the phase shifter being connected from an output of the power amplifier to an input of the power amplifier;
a coupler to the power amplifier, the coupler measuring a power amplifier parameter indicative of the adjacent channel power and configured to send a control signal to a control signal input of the phase shifter, the phase shifter shifting phase of an input to the power amplifier in accordance with the measured power amplifier parameter, in order to reduce an amount of the power amplified parameter, thus reducing the adjacent channel power; and
a variable attenuator, the attenuator reducing the amplitude or power of the adjacent channel power.

22. The circuital arrangement of claim 21, wherein the coupler to the power amplifier is coupled to an output of the power amplifier.

23. The circuital arrangement of claim 21, wherein the parameter indicative of the adjacent channel power is an odd harmonic amplitude from the output of the power amplifier and the variable attenuator reduces the amplitude or power of the odd harmonic signal.

* * * * *